(12) United States Patent
Nijdam et al.

(10) Patent No.: US 11,045,819 B2
(45) Date of Patent: Jun. 29, 2021

(54) FLUIDIC SPRAYER

(71) Applicant: MEDSPRAY B.V., Enschede (NL)

(72) Inventors: Wietze Nijdam, Enschede (NL); Henri Joseph Van Egmond, Enschede (NL); Cornelis Johannes Maria Van Rijn, Amsterdam (NL)

(73) Assignee: MEDSPRAY B.V., Enschede (NL)

( * ) Notice: Subject to any disclaimer, the term of this patent is extended or adjusted under 35 U.S.C. 154(b) by 0 days.

(21) Appl. No.: 15/781,358

(22) PCT Filed: Oct. 7, 2016

(86) PCT No.: PCT/NL2016/050699
§ 371 (c)(1),
(2) Date: Jun. 4, 2018

(87) PCT Pub. No.: WO2017/095220
PCT Pub. Date: Jun. 8, 2017

(65) Prior Publication Data
US 2018/0353977 A1    Dec. 13, 2018

Related U.S. Application Data

(60) Provisional application No. 62/262,982, filed on Dec. 4, 2015.

(51) Int. Cl.
*B05B 1/14* (2006.01)
*B65D 83/14* (2006.01)
(Continued)

(52) U.S. Cl.
CPC ............... *B05B 1/14* (2013.01); *B05B 1/3006* (2013.01); *B05B 11/007* (2013.01); *B05B 15/55* (2018.02);
(Continued)

(58) Field of Classification Search
CPC ......... B05B 1/14; B05B 15/55; B05B 1/3006; B05B 11/007; B05B 11/0005; B65D 83/7535; F16K 7/17; B81B 2201/054
(Continued)

(56) References Cited

U.S. PATENT DOCUMENTS 578,400 A    3/1897   Gilmore
2,495,587 A  10/1947  Magowan
(Continued)

FOREIGN PATENT DOCUMENTS

CN    103521371    1/2014
JP    11-138073    5/1999
(Continued)

OTHER PUBLICATIONS

International Search Report dated Jan. 30, 2017 in International (PCT) Application No. PCT/NL2016/050699.

*Primary Examiner* — Christopher S Kim
(74) *Attorney, Agent, or Firm* — Wenderoth, Lind & Ponack, L.L.P.

(57) ABSTRACT

The present invention relates to a spray device, comprising a spray nozzle body (2) and a substantially planar membrane layer (6) suspended over a nozzle cavity (3) to generate microjets, especially for pharmaceutical applications, in particular preservative free formulations. The nozzle body (2,8) contains a microbial barrier, particularly a microvalve (23,24) between a fluid supply channel (9) and said cavity (3).

33 Claims, 7 Drawing Sheets

(51) Int. Cl.
  *B05B 15/55* (2018.01)
  *B05B 11/00* (2006.01)
  *B05B 1/30* (2006.01)
  *F16K 7/17* (2006.01)

(52) U.S. Cl.
  CPC ............ B65D 83/7535 (2013.01); *F16K 7/17* (2013.01); *B05B 11/0005* (2013.01); *B81B 2201/054* (2013.01)

(58) Field of Classification Search
  USPC ........................................................ 239/546
  See application file for complete search history.

(56) References Cited

U.S. PATENT DOCUMENTS

| | | | |
|---|---|---|---|
| 3,130,919 A | * | 4/1964 | Baker .................. B05B 1/185 239/546 |
| 3,249,259 A | | 5/1966 | Corsette |
| 3,856,046 A | | 12/1974 | Brown et al. |
| 4,651,905 A | | 3/1987 | Hayes |
| 5,232,687 A | | 8/1993 | Geimer |
| 6,171,972 B1 | | 1/2001 | Mehregarty et al. |
| 7,748,647 B2 | | 7/2010 | Clerget et al. |
| 2008/0006719 A1 | | 1/2008 | Clerget et al. |
| 2011/0240127 A1 | | 10/2011 | Eberhart et al. |
| 2012/0172739 A1 | | 7/2012 | Kern |
| 2014/0202453 A1 | | 7/2014 | Merassi et al. |

FOREIGN PATENT DOCUMENTS

| | | |
|---|---|---|
| JP | 2003-503117 | 1/2003 |
| JP | 2007-175012 | 7/2007 |
| JP | 2012-530884 | 12/2012 |
| KR | 2003-0093663 | 12/2003 |
| WO | 01/00263 | 1/2001 |
| WO | 02/18058 | 3/2002 |
| WO | 2009/002178 | 12/2008 |
| WO | 2014/184006 | 11/2014 |
| WO | 2017/095220 | 6/2017 |

* cited by examiner

FLUIDIC SPRAYER

The present invention relates to a spray device, for spraying a fluidic microjet spray, comprising a spray nozzle unit, said spray nozzle unit comprising a fluid supply channel for receiving a pressurized fluid therein and comprising at least one spray nozzle having a nozzle membrane with at least one nozzle orifice for releasing a microjet spray of said fluid.

A microjet is here defined as a single or a multiple number of jets operating in the Rayleigh breakup regime. As a result, consecutive droplets may have a same size and propagate from the nozzle orifice in a same direction.

A spray device of the type as described in the opening paragraph is for instance known from US patent application 2008/0006719. This patent application describes a spray nozzle body with a support body and front wall that are formed as a single piece of plastic material. The nozzle body of this known device forms a cap with a cavity that is placed directly onto a hollow core that is part of a delivery system for supplying said pressurized liquid to the nozzle from a fluid container. The fluid container can for example be designed in the form of a pressurized bottle. It is also known to use a separate pumping device for displacing a fluid.

Spray devices may have an exit valve, which is arranged in the fluid path upstream of the spray nozzle. This known valve is operated by the user and may contribute amongst others in, safeguarding microbial integrity of the part of the spray device that is upstream of the valve, preventing dripping of the spray device after use, and in helping in reaching a preset dose passively or actively by the user. Once closed, the valve does not allow fluid which has passed and might be contaminated to re-enter the fluid container of the spray device. This should prevent any possible contamination of the contents of the fluid container as a result of fluid contaminants being taken back from the outside environment. In practice, however, the known spray device having such a valve cannot guarantee a complete mechanical closure to prevent fully the passage of microbes, due to tolerances in manufactured parts.

To further inhibit contamination, in particular of preservative-free fluids, it is further known for a spray device to provide surfaces which come into contact with the fluid, with an antimicrobial coating. As an example, U.S. Pat. No. 5,232,687 discloses a spray device with an exit valve with an antimicrobial silver coating.

For specific applications, particularly for pharmaceutical applications, it is of the utmost importance to maintain the integrity of the fluid that the spray device stores in a reservoir for consecutive dosages that are delivered to the user. Especially any microbial immigration in said reservoir and contamination of unused fluid need to be avoided as much as possible. The known spray devices fail in this respect in that even if the known exit valve is applied therein, a strict closure of said valve cannot be guaranteed and, moreover, after delivery of a dose of fluid still a relatively large amount of fluid resides in open communication with the environment through the nozzle orifices.

The present invention has for its object, inter alia, to provide a spray device that generates a fluidic microjet spray and effectively closes of substantially the entire fluid delivery system to counteract any microbial immigration into the device.

To that end a spray device of the type as described in the opening paragraph is, according to the invention, characterized in that said spray nozzle is formed by a nozzle body, comprising a support body with at least one nozzle cavity at a main surface of said support body, said support body being covered by a membrane layer at said main surface and said membrane layer being provided with at least one nozzle orifice throughout a thickness of said membrane layer at an area of said at least one nozzle cavity to form said nozzle membrane over said nozzle cavity, in that said nozzle body comprises at least part of said fluid supply channel, and in that, upstream of said nozzle cavity, said nozzle body comprises a microbial barrier between said cavity and said at least part of said fluid supply channel that resides inside said support body.

The nozzle body of the spray device according to the invention is formed in a support body that in itself includes a microbial barrier just upstream of the cavity to seal of the fluid supply channel that holds a considerably larger volume of liquid. The support body may be made, at least partly, of semiconductor material or another material that allows extremely accurate and reproducible semiconductor technology or micromachining manufacturing steps to be used for manufacturing and configuring the nozzle body.

Not only a precise form, size and position of the individual membranes, cavities and nozzle orifices may thus be controlled extremely accurately, also a microbial barrier may thus be integrated already within nozzle body. This leaves merely a relatively tiny volume of the cavity itself that is not jet cut off after spraying while the majority of fluid in the spray device is sealed against the entrance of any microbial contamination. This renders this device particularly suitable for sophisticated applications that require preservative free fluids and for pharmaceutical applications. Due to the invention, several problems that are related to microbial contamination from the outside environment are, hence, alleviated.

A preferred embodiment of the spray device according to the invention is characterized in that said microbiological barrier comprises microvalve means that open once a predetermined upstream pressure threshold is exceeded and are in a normally-closed state in a non-pressurized state and that are provided upstream of said cavity between said cavity and said fluid supply channel. The microvalve means can be progressive valve means having a valve disc that opens further the more upstream pressure is exerted. In that case the threshold pressure is defined to be the upstream pressure level at which the fluid flow resistance over the valve means becomes negligible or at least orders of magnitude lower than the fluid resistance over the at least one nozzle orifice. Alternatively, the valve means may comprise a cut-off valve featuring a valve disc that switches instantly from a substantially fully closed state to a substantially fully opened state, changing the fluid flow resistance from virtually infinite to zero once a certain threshold pressure is exceeded.

In order to increase the threshold pressure, while also securing a proper closing of the valve means after use, a preferred embodiment of the spray device according to the invention is characterized in that said valve means comprise a valve disc that is provided with resilient pressure means that force said valve disc against a valve seat in the normally-closed state.

A specific embodiment of the spray device according to the invention in this respect is characterized in that the valve means open at a pressure threshold of between 2 and 5 bar and close once the downstream pressure thereon drops below a value that is lower than said pressure threshold, particularly below a value of between 1 and 2 bar. These valve means are designed to prevent dripping or drooling of the spray device during and after use.

The valve means only open when said pressure threshold value of between 2 and 5 bar is reached, and close instantly when the pressure drops below a lower value, particularly of between 1 and 2 bar. With special designs with respect to the dimensions and other properties of the valve disc, like thickness, stiffness, diameter, presence of corrugations zones, and the valve seat, like the inner and outer seat diameter, contact area between valve seat and valve disc, and the use of MEMS surface micromachining techniques many possible designs can be constructed to this effect.

A specific embodiment of the spray device according to the invention is characterized in that said microvalve means comprise at least one microvalve disc in close proximity of a microvalve seat, said microvalve disc resting on said microvalve seat in said normally-closed state and lifting from said seat once said upstream pressure threshold is exceeded to create a fluid passage between said microvalve disc and said microvalve seat. Again the valve disc may behave progressively, opening to a greater extent the more the threshold pressure is exceeded, or as a cut-off valve that opens instantly to a maximum upon exceeding the threshold pressure.

According to the invention a good means to guarantee microbial safety has been obtained with a particular embodiment to downscale the size of the nozzle cavity. To that end, a further preferred embodiment of the spray device according to the invention is characterized in that said support body comprises at least part of said fluid supply channel, in that, upstream of said nozzle cavity, said support body comprises a microbial barrier between said cavity and said at least part of said fluid supply channel that resides inside said support body, and in that said microvalve disc and said membrane are both formed by said membrane layer.

This preferred embodiment of the spray device features a substantially planar nozzle body having a cavity that may extend from said first main surface to a second, back surface thereof. The membrane layer is resting on a valve seat and is movable upon an applied spray pressure, thereby creating a fluid passage between the membrane layer and the valve seat. With this valve seat a passive valve structure or flow barrier is created allowing fluids to pass only when the membrane layer is lifted up from the valve seat and sealing the nozzle/passive valve cavity below when closed. The membrane layer is in this embodiment according to the invention designed as a valve disc that lifts up from the valve seat after pressurizing the fluid in the fluid supply channel.

Where the use of a separate nozzle chip and separate valve chip the nozzle cavity would have a typical size of a million cubic micron the nozzle cavity of this embodiment may easily be reduced to a typical size of only a few hundred cubic microns. With preference the valve disc is made of a thin layer of silicon nitride with a thickness of 0.5-1.5 micron. Such a layer may be deposited on a nozzle support body that is formed in a polished silicon wafer and in which also a valve seat is constructed together with a liquid supply channel that extends through the wafer.

In a further special embodiment, the spray device according to the invention is thereby characterized in that a maximum distance between said valve disc and said valve seat is less than 500 nanometres, in particular less than 100-200 nanometres, in said normally-closed state. This creates a microbial barrier between said fluid supply channel and said cavity as living or dead bacteria are not able to pass barriers with a height of less than 100-200 nanometre. The valve system according to the invention, hence, prevents microbial contamination of any fluid upstream of the valve means. As a result, a considerable reduction in the growth of colony-forming units (CFU) in a pharmaceutical liquid after use of the spray device can be obtained by using an appropriate micro valve between the membrane and a container holding the pharmaceutical liquid.

The spray device may be further characterized in that in closed position the valve disc and the valve seat are sealed by close contact or stiction forces, such as van der Waals or Casimir forces. Van der Waals forces are very strong when the distance between the valve seat and the valve disc is less than 1 nanometre. The strength of the Casimir force strongly increases when the separation between the surfaces is already less than 10-100 nanometre. These forces can further contribute to the collapse and stiction of the valve disc on the valve seat, especially when the surfaces are smooth, such as is the case of spray nozzle units made with MEMS surface micromachining techniques.

It is an insight according to the invention that with silicon micromachining such maximum distances between valve disc and valve seat can be manufactured in a reproducible fashion meeting pharmaceutical standards. The SNU and especially the nozzle and valve parts may be produced by micromachining (Micro System Technology) which means that it is produced using lithography steps related to semiconductor fabrication methods. Alternatively spark erosion and laser drilling techniques may be used, but in general these tend to be less reproducible and less precise in comparison with micromachining methods.

In a further embodiment the spray device according to the invention is characterized in that said valve disc is configured to bend during operation from a substantially flat initial state to an at least partly curved profile under pressure while creating said fluid passage, and in that said valve seat comprises a closed edge that is located at the area of said curved profile of said valve disc, and more specifically in that said valve disc is configured to bend in that said valve disc is corrugated, comprising at least one generally ring-shaped corrugation along a generally ring-shaped valve seat. Said fluid supply channel is in open communication with an interior of said ring-shaped valve seat The formation of corrugations in the valve disc provides the membrane with a certain amount of flexibility, even for rigid materials like silicon nitride, silicon oxide, silicon carbide and other ceramic materials, that facilitates opening and closing of the valve. It was found that corrugated valve discs exhibit an initial larger stiffness than non-corrugated, flat valve discs, but said stiffness reduces at higher pressure. Such a valve disc with corrugations, mounted on a valve seat, shows a better closing capability at low pressures and a lower fluid resistance at higher pressure as compared to a non-corrugated valve disc.

Other measures to prevent microbiological contamination, apart from a pure mechanical barrier, may also be incorporated in the spray device, such as the presence of an air barrier between the valve cavity and the nozzle cavity and/or the use of anti-microbial coatings at specific locations in the spray nozzle unit. A further special embodiment of the spray device, accordingly, is characterized in that said microbial barrier comprises an air chamber between said microvalve means and said nozzle cavity, said air chamber locking a quantity of air in said normally-closed state.

An embodiment of the spray device exhibiting an air barrier is characterized in that below said main surface the microvalve unit comprises at least one microbial blocking region and at least one air holding chamber between said microvalve and said nozzle cavity, forming a pressure dependent flow barrier allowing fluids to pass only when the pressure has reached a threshold value, and blocking the fluid communication between the membrane and the fluid supply channel when the pressure is well below the threshold value with at least one air bubble originating from the air holding chamber. After release of the operating pressure an air bubble will reappear in a valve channel between said microvalve and said cavity and the fluid communication between the membrane and the valve will be blocked.

With preference the microbial blocking region has one lateral dimension less than 100 microns and a hydrophobic surface. The term hydrophobic is here defined as a general surface property to form a fluid/air surface contact angle ($\theta$) larger than 90° with the specific spray liquid, which may contain for example water, glycerine or ethanol. This means that the air is able to repel or withstand the spray fluid with a pressure of about $P=(\gamma \cos \theta)/h$, with $\gamma$ the corresponding value of the surface tension between the fluid and the material of the microbial blocking region and h the height of the blocking region. Typical values of P with h less than 1 micron, and $\gamma$ between $20.10^{-3}$ and $75.10^{-2}$ N/m are larger than 1 bar.

A preferred embodiment of the spray device according to the invention is characterized in that an inner wall of said air chamber has a hydrophobic surface, in particular by means of a hydrophobic antimicrobial coating such as a quaternary-ammonium coating.

Also with preference the air holding chamber and the air blocking region is designed such that the blocking air bubble will not be separated from the air in the air holding chamber. This means that air in the air holding chamber and air in the blocking region remain interconnected before, during and after using the spray device. Preferably, the air holding chamber is considerably larger than the air blocking region and the fluid/air surface contact angle of the air blocking region is larger than the fluid/air surface contact angle of at least a part of the air holding chamber. This enables that some part of the air holding chamber can be filled with fluid, whereas the blocking region is still completely filled with air.

In another embodiment the spray device according to the invention is characterized in that said air chamber is in open communication with an outer atmosphere of said support body via a microbial filter allowing air to re-enter the air chamber after spraying said fluidic microjet spray. The air holding chamber is separated from the blocking region by a fluid restriction which has at least one height dimension of less than 200 nanometres and has a fluid/air surface contact angle larger than 90°, forming a fluid resistance preventing the spraying liquid to enter the air holding cavity up to spray pressures of the order of typically 10 bar, but allowing air to re-enter the blocking region after depressurizing of the spraying device.

Alternative means to remove liquid from the blocking region that is formed by or around said barrier means, is provided by a further embodiment of the spray device according to the invention that is characterized in that an air-purging chamber is provided, in that said air-purging chamber is pressurized before or during spraying via a pressurizing channel in the support body, in that pressurized air from the air-purging chamber is released after the spraying via a release channel to purge the air chamber and the nozzle cavity, and in that the air-purging chamber receives environmental air via a microbial filter.

Any fluid that remained behind may be expelled from the cavity after spraying by using such an air-purging chamber. The air-purging chamber may comprise an inlet in open communication with the spray chamber that actuates a piston with a return spring to pressurizes the purging chamber through a one-way valve by pushing the air from the piston chamber into the pressure chamber. After depressurizing the spray, the piston chamber is refilled through another one-way valve in open communication with the outside environment with a microbial filter in place, while the air in the pressure chamber is pushed out through a third one-way valve into the blocking region, recreating the fluid resistance.

The presence of a nozzle cavity is a crucial element or inherent risk with respect to the microbial safety of the spray device, because this cavity is in contact with the outer environment. Reducing the size of this cavity obviously downscales the number of potential microbial CFU that may grow after use of the spray device. Micromachining of the nozzle parts of the SNU is a second good measure to downscale the nozzle cavity.

According to the invention another means to reduce the number of CFU is to drain excess spray fluid away from the nozzle orifices that may have left behind after use of the spray device. This can be obtained by capillary action, e.g. with an absorbent or with an appropriate surface coating. A particular embodiment of the device according to the invention is characterized in that, at least at an area adjacent said at least one nozzle orifice, a bare surface of said spray nozzle has been treated to expel excess fluid away from a nozzle orifice, and more particularly in that said bare surface is hydrophobic adjacent said orifice, particularly due to a hydrophobic antimicrobial coating, such as a quaternary ammonium coating, applied to said support body at said main surface.

A special embodiment of the device according to the invention is characterized in that support body is provided with a combination of at least one hydrophobic coating and at least one hydrophilic coating at said bare surface, at least surrounding said at least one orifice, said combination of coatings being micropatterned to promote a fluid movement away from the nozzle orifices. Micropatterned hydrophobic and hydrophilic coatings can be configured to enhance fluid movements and drain excess fluid away from the nozzle orifices.

With preference the nozzle orifices themselves have a hydrophobic region to push away excess fluid not only from the bare surface, but also out of the nozzle orifice itself, in order to create a dry antimicrobial air gap. The evacuation of fluid from the orifices themselves is further enhanced in a further embodiment in which said at least one nozzle orifice tapers down towards a bare surface of said nozzle body. These nozzle orifices taper in an inward direction towards the main surface to enable an outward capillary force driving the fluid out of the nozzle orifice. If all orifices in the membrane layer are filled with air this will prevent any microbial transport from any excess fluid on the outside of the membrane from further intrusion into the spray device.

Surprisingly, it has been found that embodiments in which the height of the nozzle cavity is less than the diameter of the nozzle cavity, have favourable spray characteristics and good microbial integrity. It is conceived that the outward propelling capillary pressure (cf. Laplace pressure) of a nozzle cavity is in that case sufficient to overcome the capillary pressure of a nozzle orifice.

Another means to reduce the CFU is to provide an antimicrobial coating in the nozzle cavity. To this end, a further embodiment of the device according to the invention is characterized in that said at least one cavity is provided with an antimicrobial coating over at least part of an interior wall thereof, in particular a hydrophobic antimicrobial coating such as a quaternary-ammonium coating With preference the nozzle cavity has moreover means to expel fluid via the nozzle orifice(s) in order to create a dry antimicrobial air gap in the nozzle cavity itself. With preference the nozzle cavity is therefore provided with a hydrophobic surface and is negatively tapering towards the surface to enhance an outward capillary force driving the fluid out of the nozzle cavity. If the nozzle cavity is filled with air this will prevent any microbial transport from further intrusion into the spray device. In particular the nozzle cavity should be as small as possible, not only to limit the total fluid volume, but also to increase the capillary force driving the fluid out of the nozzle cavity. This can be done by tuning the appropriate dimensions of the nozzles with the appropriate dimensions of the nozzle cavity.

According to the invention the spray device may further comprise an air valve to enable the inflow of air from the outside environment to the nozzle cavity. With preference the air valve has a microbial-safe hydrophobic filter at the outside and a separate hydrophobic cavity beneath the filter area in fluid connection with the hydrophobic nozzle cavity. In this way the fluid retained in the nozzle cavity after spraying can be fully emptied by capillary force only.

A further embodiment of the spray device according to the invention is characterized in that a substantially airtight closure cap is provided over said nozzle body. Such an airtight closure cap can be passively or actively opened during spraying and closed after spraying to prevent further microbial contamination from the outside environment. It further comprises means to behold a specific microclimate above the membrane layer that helps to guarantee the required lifetime of the spray device.

A further particular embodiment of the spray device according to the invention is characterized in that said support body comprises a plurality of cavities that are distributed at said main surface, particularly distributed angularly at said main surface, each one of said cavities being spanned by a nozzle membrane, and in that said support body comprises a common microbial barrier between said cavities and said fluid supply channel, upstream of said cavities. This embodiment enables a fluid spray over an extended surface area to produce an aerosol by a number of distributed orifices, while the shared microbial barrier preserves the integrity of the fluid that is in the fluid supply channel and/or upstream reservoir.

Alternatively, the spray device according to the invention may be characterized in that said support body comprises a plurality of nozzle cavities opening at said main surface of said support and being covered by a nozzle membrane having at least one nozzle orifice, and in that said cavities are each provided with similar microvalve means between said cavity and a fluid supply channel, particularly a common fluid supply channel that is shared among the orifices. In that case the barrier means of the orifices may be pressurized together or individually.

It has been found that a cavity underneath said membrane having a generally circular lateral cross section, i.e. a substantially cylindrical cavity, provides a favourable distribution of tensile forces over the membrane. A preferred embodiment of the spray device according to the invention is, hence, characterized in that said cavity has a generally circular cross section at said main surface. As a result, the membrane may endure a relatively large spray pressure applied over the orifice(s).

The spray device according to the invention may further comprises a liquid supply system for supplying a pressurized liquid to said fluid supply channel of said at least one spray nozzle.

The present invention further relates to a spray nozzle body and will be illustrated in greater detail with reference to a number of examples and an accompanying drawing.

DESCRIPTION OF THE DRAWING

In the drawing.

It should be noticed that the figures are drawn schematically and not to scale. In particular, certain dimensions may be exaggerated to a higher or lesser extent in order to improve the overall intelligibility. Corresponding parts are denoted by a same reference sign throughout the drawing.

TECHNICAL DESCRIPTION OF THE PREFERRED EMBODIMENTS

Figure 1:
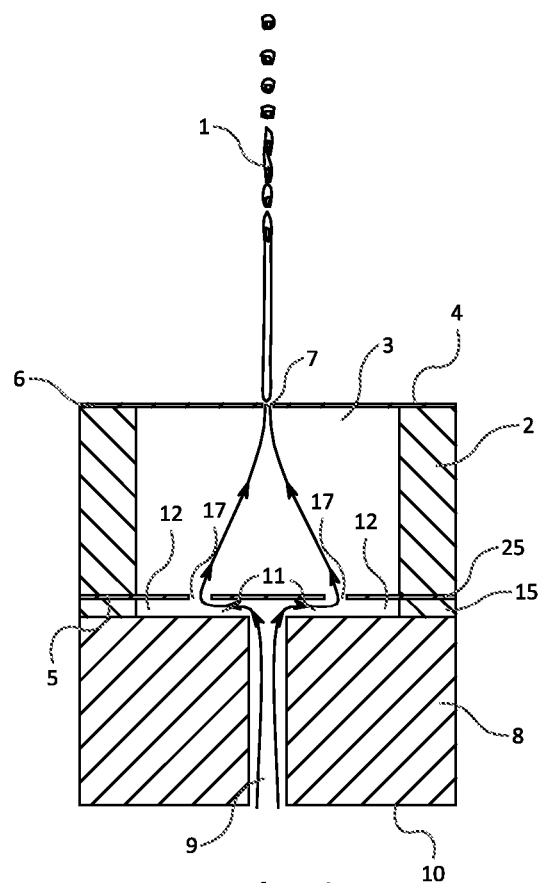
FIG. 1 shows a cross section of an embodiment of a nozzle body of a spray device according to the invention.

FIG. 1 shows a cross section of a spray nozzle of an embodiment of a device for spraying at least one fluidic microjet 1 according to the invention. The spray nozzle comprises a nozzle body that is this case comprises a support body (2) together with a base body 8 that support the membrane support body 2. The support body 2 is made preferably from silicon with a typical thickness between 30 and 675 microns. One or more basically cylindrical nozzle cavities 3 with a diameter of 10-100 microns extend from a first main surface 4 to a second main surface 5 throughout the thickness of the support body 2.

The support body 2 carries a membrane layer 6. The membrane layer 6 preferably is made from a thin-film material like silicon, silicon nitride, silicon carbide, silicon oxide, diamond-like films or other ceramic compositions. At the area of the cavity 3 at least one nozzle orifice 7 with diameter of typically between 0.5 and 20 microns is formed in said membrane layer 6 in fluid communication with said cavity 3 to form a perforated membrane at said first main surface side 4 of said support body 2.

At the second main surface 5, the support body 2 is carried by the base body 8 that comprises a fluid supply channel 9. The fluid supply channel has a diameter between 10 and 100 microns at a length of typically between 100 and 675 microns and extends from the second main surface 5 to a back surface 10 of the base body 8, where it connects to a fluid supply system that delivers a pressurized fluid from a reservoir or the like, not shown. Like the support body 2, the base body comprises a silicon body. The thickness of the silicon body that form the base body is typically between 100 and 675 microns. According to the invention, a microbial barrier is provided between said cavity 3 and said fluid supply channel 9. The microbial barrier comprises a microvalve unit having at least one microbial blocking region 11. The microvalve unit is formed from a silicon-nitride layer 25 that is deposited over a silicon-oxide layer 15 that was grown or deposited onto the silicon base body 8. Openings 17 are etched in the silicon-nitride layer 25 to create a valve exit that communicated with the fluid supply channel 9 via a blocking region 11 that is adjacent at least one air chamber 12. The blocking region has a height of between 0.05 and 2 microns and the air chamber 12 has a volume of between 2 and 30,000 cubic microns. Together the blocking region 11 and the air chamber 12 form a pressure-dependent flow barrier allowing the fluid to pass only when the supply pressure has reached a threshold value, and blocking the fluid communication between the nozzle cavity 3 and the fluid supply channel 9 when the pressure is well below said threshold value. In the latter case, at least one air bubble originating from the air chamber 12 blocks microorganisms to pass the blocking region 11 of which at least one height dimension is less than 2 microns and a fluid/air surface contact angle is larger than 90°.

Figure 2:
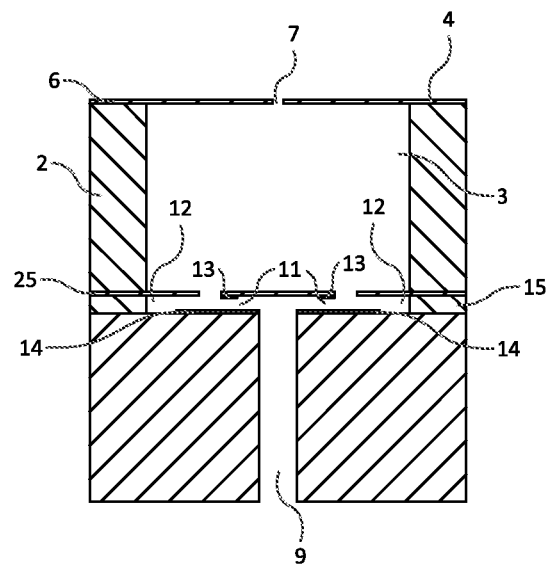
FIG. 2 shows a cross section of a preferred embodiment of a nozzle body of a spray device according to the invention.

With preference, as depicted in FIG. 2, the microbial blocking region 11 has an appropriate hydrophobic surface coating 13, in particular it comprises a hydrophobic antimicrobial coating, such as a quaternary-ammonium coating. The hydrophobic coating 13 is applied on different sides of the blocking region 11 to enable full closure of this part of the valve channel. Also the air chamber 12 and the microbial blocking region 11 can be designed such that the blocking region will contain a blocking air bubble that will not be separated from the air in the air chamber 12. The air chamber 12 is considerably larger than the blocking region 11 and that the fluid/air surface contact angle of the blocking region 11 is larger than the fluid/air surface contact angle of at least a part of the air chamber 12. With preference the same, or a bit less hydrophobic, but still antimicrobial coating 14 is applied over specific interior portions of the air chamber 12.

Figure 3:
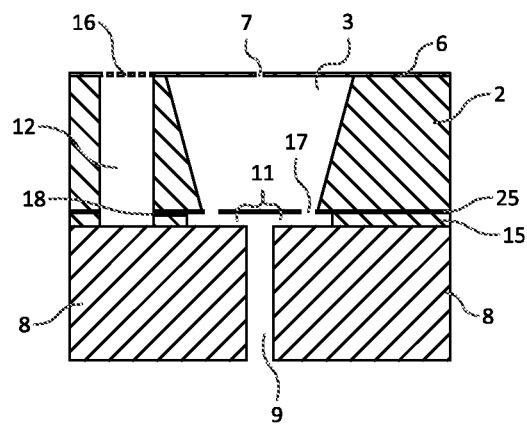
FIG. 3 shows a cross section of a further embodiment of a nozzle body of a spray device according to the invention.

Another embodiment is shown in FIG. 3 in which an air chamber 12 is in open communication with the outer atmosphere via a microbial filter 16 integrated in the membrane layer 6. The filter 16 allows air to enter the air chamber 12 after spraying. The air chamber communicates with the blocking region 11 via a narrow slit 18 that forms a fluid restriction but allows air to pass. At least one height dimension of fluid restriction 18 is less than 200 nanometres and a fluid/air surface contact angle is larger than 90°. This creates a fluid resistance through the restriction 18 that prevents the spraying liquid to enter the air chamber 12 under a spray pressures of the order of 10 bar. The filter 16 is made in the same membrane layer 6 that also forms the membrane with the orifice 7 over the cavity 3.

Figure 4:
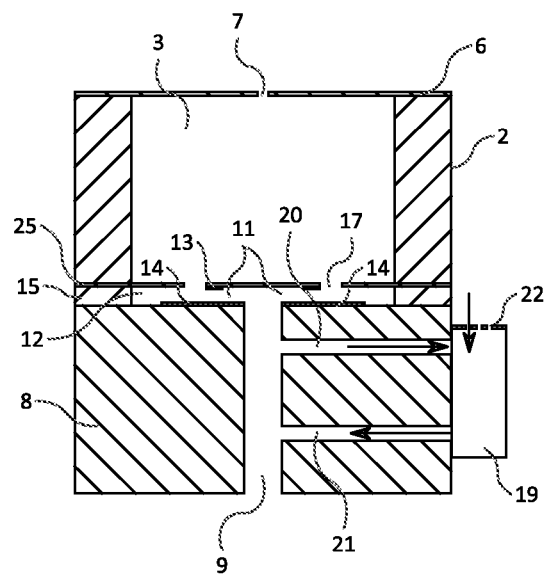
FIG. 4 shows a cross section of a further embodiment of a nozzle body of a spray device according to the invention.

Another embodiment is shown in FIG. 4 in which an air-purging chamber 19 is placed outside the valve-unit support body 8. This chamber 19 is pressurized before or during spraying via a pressurizing channel 20 in the base body 8. Pressurized air from the air-purging chamber 19 is released after the spraying via a release channel 21 to purge the blocking region 11 and the nozzle cavity 3. The external air-purging chamber 19 is refilled with air via an external microbial filter 22.

Figure 5:
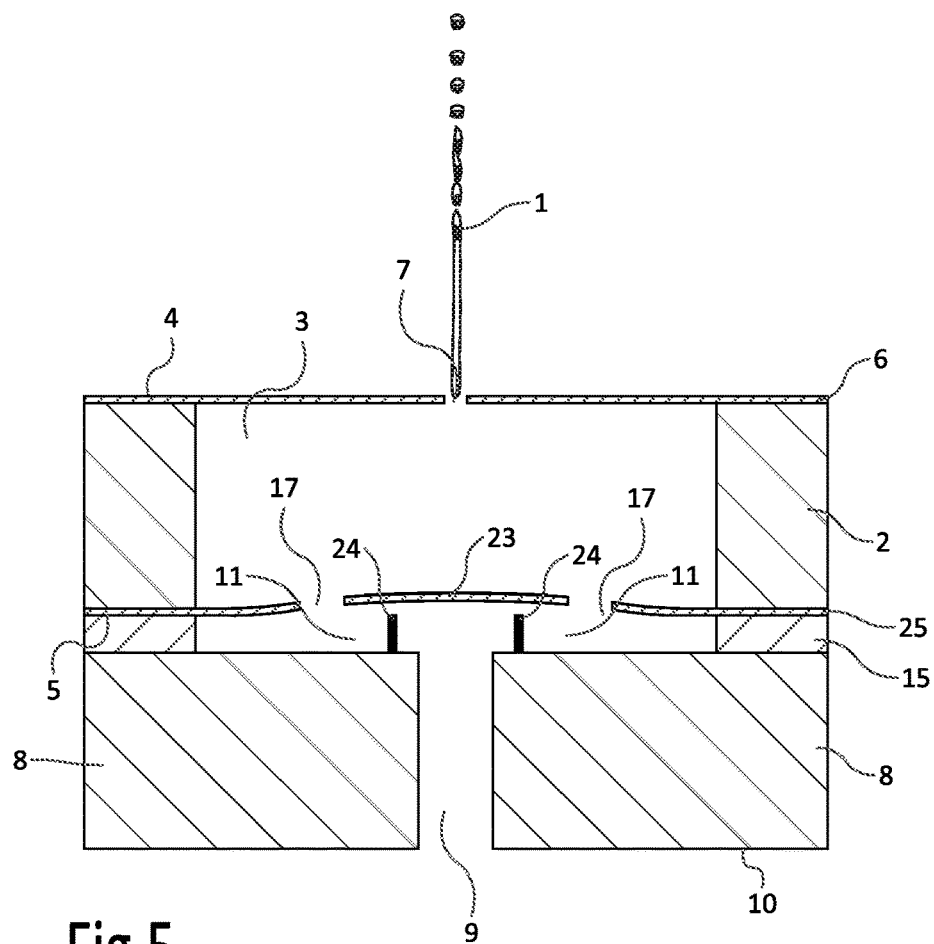
FIG. 5 shows a cross section of a further embodiment of a nozzle body of a spray device according to the invention.

The cross section of another embodiment is shown in FIG. 5 of a device for spraying at least one fluidic microjet 1. The nozzle body comprises a substantially planar nozzle-plate-support body 2 having a nozzle cavity 3 extending from a first main surface 4 to a second main surface 5 thereof. The support body 2 comprises a thin membrane layer 6 having at least one nozzle orifice 7 in fluid communication with said cavity 3 at said first main surface 4 of said nozzle-plate-support body 2. At a second main surface 5 a microbial microvalve is placed between said cavity and a fluid supply channel 9.

Said microvalve is provided to a base body 8 having said fluid supply channel 9 extending from the second main surface 5 to a back surface 10 thereof. The microvalve comprises a valve disc 23 resting on a valve seat 24, creating a microbial flow barrier that allows fluids to pass only when a certain supply threshold pressure is exceeded that would lift up the valve disc 23 from the valve seat 23, while sealing the supply channel 9 below said threshold pressure at which said valve is closed.

Both the spray nozzle 3,6 and the micro valve unit 23,24 can be made using standard (silicon) micromachining methods. The material of the support bodies 2,8 can be silicon, the membrane layer 6 can be silicon-rich silicon nitride, and the valve seat 24 can be made of silicon oxide. Of course other material combinations are likewise possible, such as the use of polymeric materials or metals for all different functional components.

Figure 6:
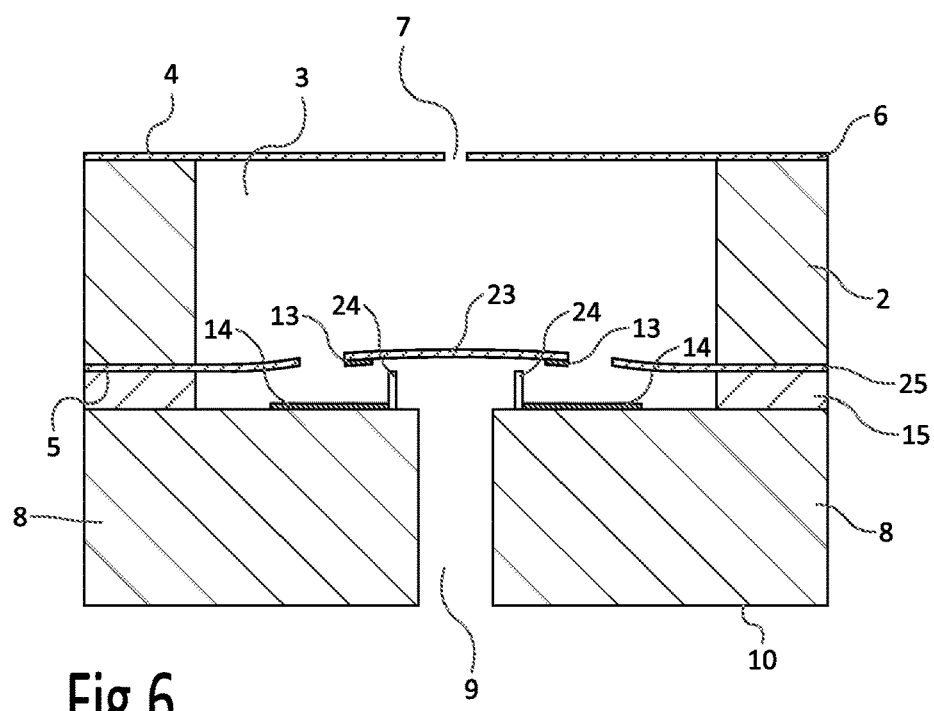
FIG. 6 shows a cross section of a further embodiment of a nozzle body of a spray device according to the invention.

With preference as depicted in FIG. 6 the microvalve unit comprising a valve disc 23 resting on a valve seat 24 is provided at an (air bubble) blocking region 11 with an appropriate hydrophobic surface coating 13. In particular this coating comprises a hydrophobic antimicrobial coating, such as a quaternary ammonium coating. An air chamber 12 and the (air bubble) blocking region 11 can be designed such that a blocking air bubble will not separate from the air in the air chamber 12. The air holding chamber 12 is considerably larger than the blocking region 11 and that the fluid/air surface contact angle of the air blocking region 11 is larger than the fluid/air surface contact angle of at least a part of the air holding chamber 12. With preference the same, or a bit less hydrophobic (but still antimicrobial), coating 14 is applied over specific parts in the air chamber 12.

Figure 7:
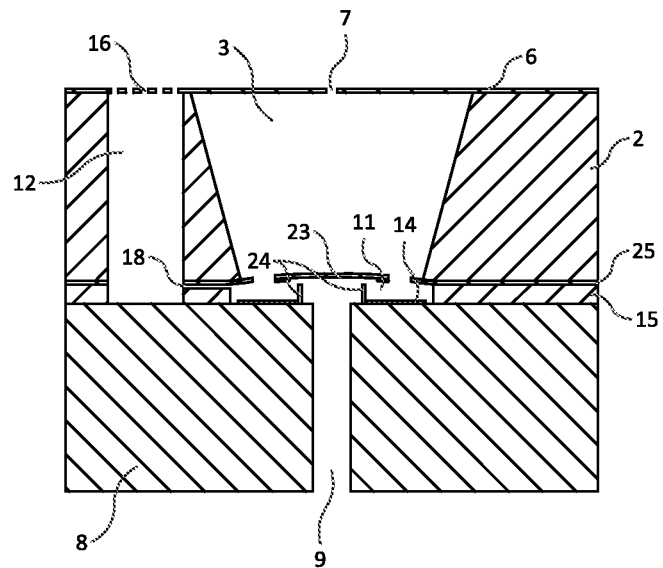
FIG. 7 shows a cross section of a further embodiment of a nozzle body of a spray device according to the invention.

Another embodiment of a nozzle body of a spray device according to the invention with an microvalve unit comprising a valve disc 23 resting on a valve seat 24 is shown in FIG. 7. The microvalve comprises a blocking region 11 around said seat 24. An air chamber 12 is in open communication with the outer atmosphere via a microbial filter 16 integrated in the membrane layer 6 that also forms the membrane over the cavity 3. The filter 16 allows air to re-enter the blocking region 11 via a narrow fluid restriction 18 after spraying. Said fluid restriction 18 is located in between the air chamber 12 and the blocking region 11. At least one height dimension of the fluid restriction 18 is less than 200 nanometres and has a fluid/air surface contact angle larger than 90° to form a fluid resistance through the restriction 18 that prevents spraying liquid to enter the air holding cavity 12 up to spray pressures of the order of 10 bar.

Figure 8:
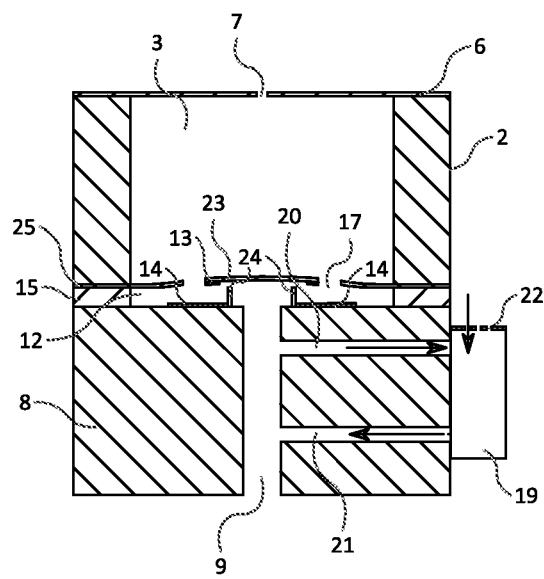
FIG. 8 shows a cross section of a further embodiment of a nozzle body of a spray device according to the invention.

FIG. 8 shows another embodiment of a nozzle body 2,8 with the microvalve unit comprising a valve disc 23 resting on a valve seat 24. An air-purging chamber 19 is placed outside the valve-unit support body 8. This chamber 19 is pressurized before or during spraying via a pressurizing channel 20 in the base body 8 and that the pressurized air from the air-purging chamber 19 is released after the spraying via a release channel 21 to purge the blocking region 11 and the nozzle cavity 3. The external air holding chamber 19 is refilled with air via an external microbial filter 22.

Figure 9:
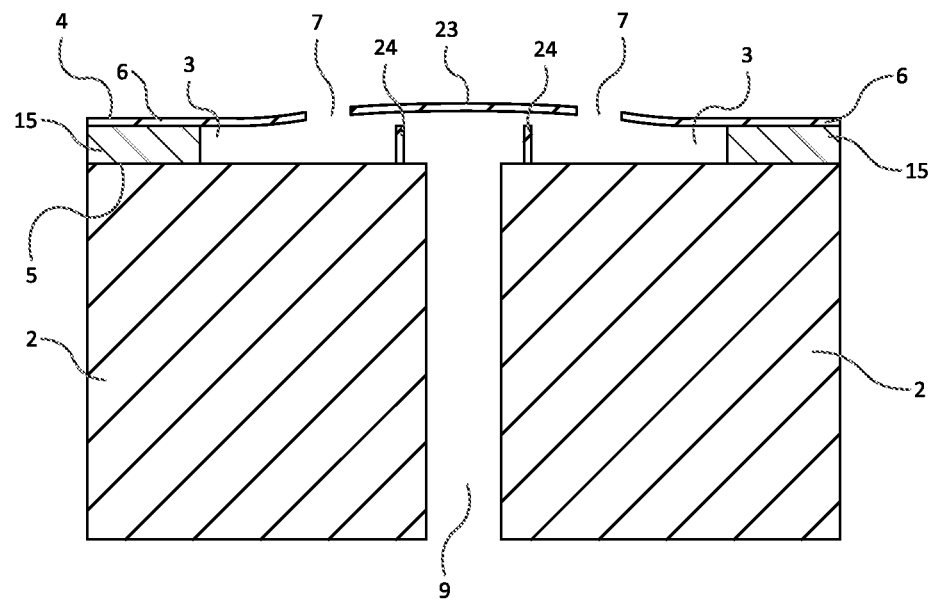
FIG. 9 shows a cross section of a further embodiment of a nozzle body of a spray device according to the invention.

A reliable means to guarantee microbial safety has been obtained with a preferred embodiment of the spray device according to the invention by downscaling the size of the nozzle cavity and by integrating the nozzle orifice 7 and the valve disc 23 in a single layer. FIG. 9 depicts an example of a nozzle body in cross section of such a preferred embodiment of a spray device for spraying fluidic microjets. The nozzle body comprises a substantially planar nozzle-plate support body 2 having a cavity 9, that is typically made from silicon. The cavity is cylindrically shaped with a length of between 100 and 675 microns, corresponding to the thickness of the silicon body 2, and a diameter of typically between 10 and 50 microns. The cavity 9 extends from a first main surface 4 to a second main surface 5 of the support body.

At the first main surface 4, a silicon-oxide layer 15 is deposited or grown onto the silicon body 2 and a silicon-rich-silicon-nitride membrane layer 6 is deposited on the silicon-oxide layer that is beforehand covered by a thin sacrificial layer, not shown. The silicon-nitride membrane layer 6 is locally etched using photolithography and conventional semiconductor processing technology to create at least one nozzle orifice 7 with a diameter of typically between 0.5 and 20 microns in fluid communication with the cavity 9 at said first main surface side of said nozzle-plate-support body 2.

The silicon-oxide layer 15 is etched underneath the silicon-nitride membrane layer 6 to form a cavity 3 and by etching the sacrificial layer, not shown, the silicon-nitride layer is released from the silicon oxide in the middle thereby forming a valve disc 23 resting on a valve seat 24. The valve seat 24 is substantially ring-shaped, having a circular cross-section with an inner core that was etched via a bore in the silicon body that forms the fluid channel 9. The valve seat has typically an inner diameter of between 15 and 55 microns and a width of typically between 1 and 10 microns. The valve disc 23 is movable with height differences of typical 50 nanometres up to 5 microns upon an applied spray pressure, herewith creating a fluid passage between the valve disc 23 and the valve seat 24.

With this valve seat 24, a passive-valve structure or flow barrier is created allowing fluids to pass only when the valve disc 23 is lifted up from the valve seat beyond a certain upstream threshold pressure to create a fluid flow path from the fluid channel 9 via the cavity 3 to the orifice(s) 7. Once the pressure drops below a certain threshold value, that need not necessarily be the same as the threshold that opens the valve, the valve disc 23 will return to the valve seat 24 to thereby close the valve and seal the cavity 3 from the fluid channel 9.

The valve disc 23 is made preferably of thin film material, like silicon, silicon nitride or silicon carbide, with a thickness of between 500 and 1500 nanometres and has a diameter of between 25 and 100 microns. The nozzle cavity 3 in between the microvalve and the nozzle orifice(s) typically may be created with a volume of the order of a few hundred cubic microns, whereas with the use of a separate nozzle chip and separate valve chip the nozzle cavity would have a typical size of a million cubic microns. It will be clear that the number of CFU that may be present in the nozzle cavity 3 will be severely reduced. The nozzle cavity 3 may, moreover, also function as a small air blocking region that further preserves the integrity of the fluid contained upstream of the valve.

With preference in closed position the maximum distance between the valve disc and the valve seat is less than 200 nanometres, in particular less than 100 nanometres, herewith forming an antimicrobial barrier between the nozzle cavity and the valve cavity.

The height of the nozzle cavity can be chosen smaller than the size of the nozzles, herewith enabling repulsion from fluid outside the nozzle cavity due to surface tension forces.

Figure 10:
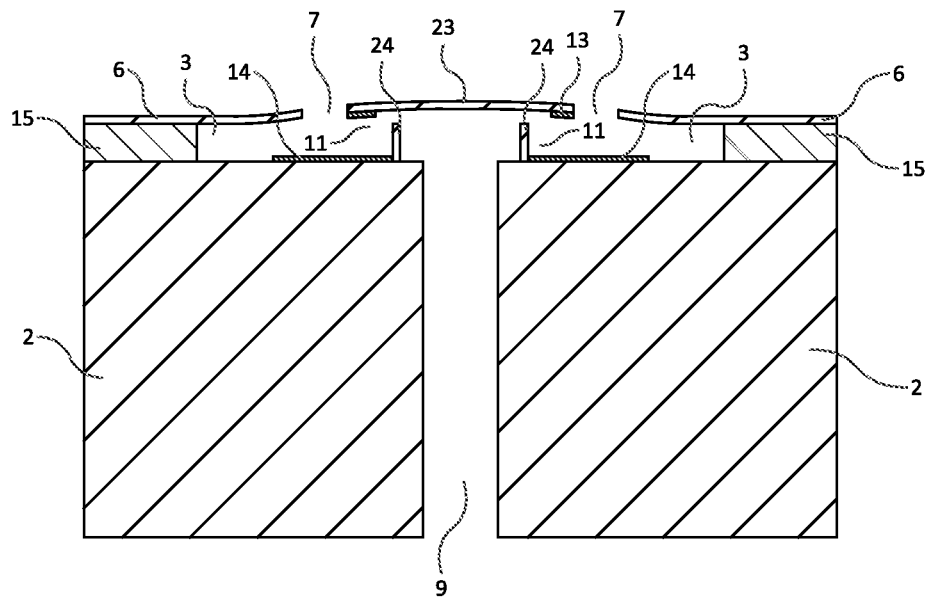
FIG. 10 shows a cross section of a further embodiment of a nozzle body of a spray device according to the invention.

An embodiment as depicted in FIG. 10 of the combined microvalve membrane layer unit comprising a valve disc 23 resting on a valve seat 24, is characterized in that an (air bubble) blocking region 11 with an appropriate hydrophobic surface coating 14 is provided, characterized in that an valve disc is integrated in the unperforated part of the membrane layer 6 resting on a valve seat 24 in a closed position and that the membrane layer is movable upon an applied spray pressure, herewith creating a fluid passage between the membrane layer and the valve seat. Herewith an outward repulsion from fluid inside the nozzle cavity due to surface tension forces is enabled, herewith safeguarding microbial integrity due to a blocking air passage inside the nozzle cavity.

Figure 11:
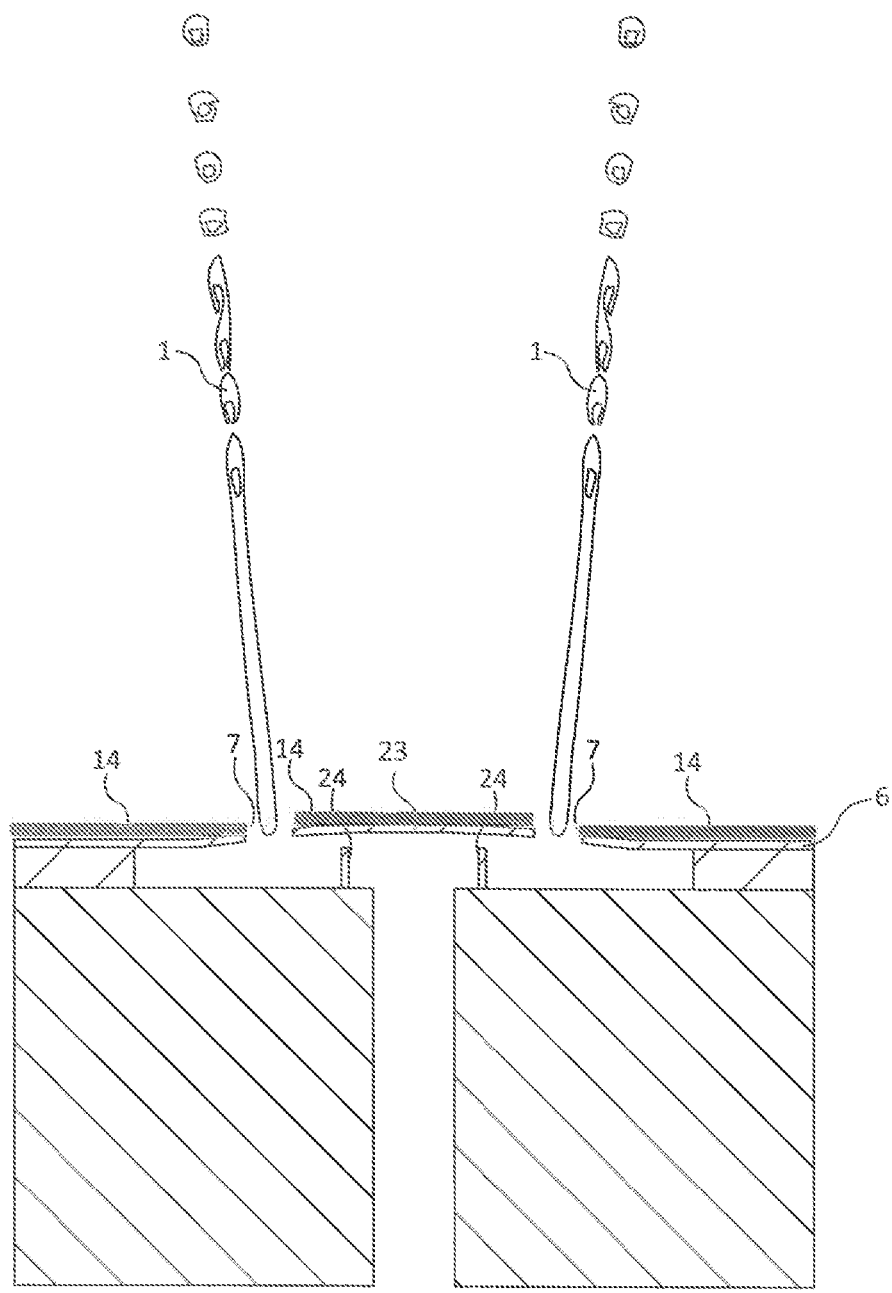
FIG. 11 shows a cross section of a further embodiment of a nozzle body of a spray device according to the invention.

The cross section of another embodiment in FIG. 11 of a combined microvalve membrane layer unit comprising a valve disc 23 resting on a valve seat 24 is characterized in that the outer surface of the membrane layer 6 is provided with a hydrophobic surface coating 14 to drain excess spray fluid away from the nozzle orifice(s) 7 after use of the spray device.

Figure 12:
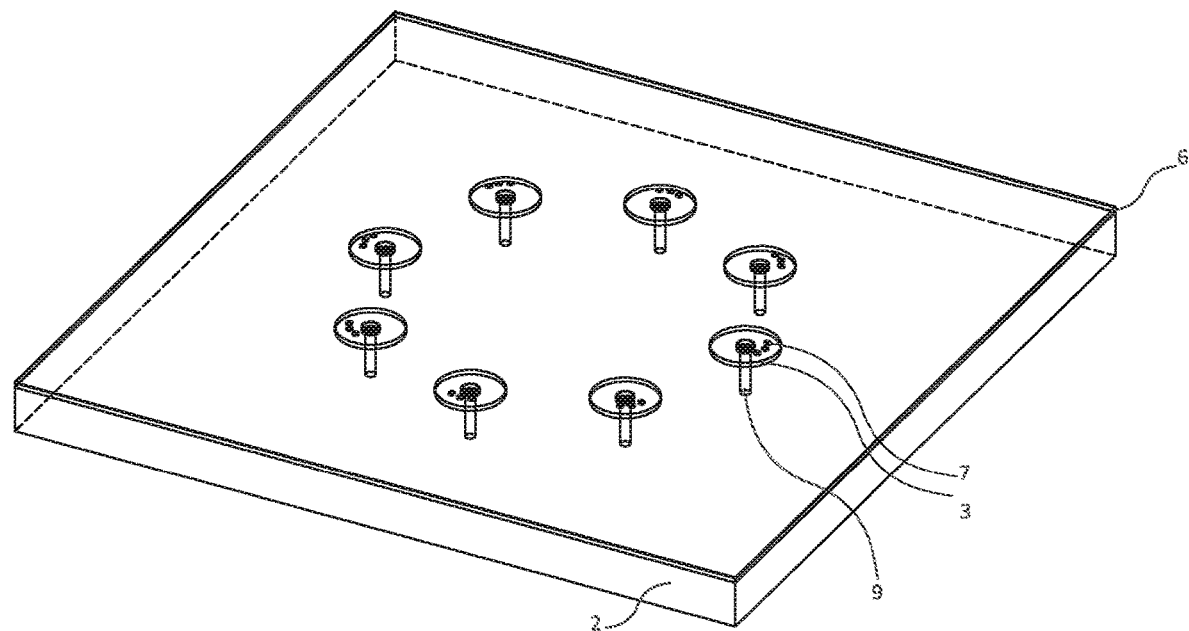
FIG. 12 shows a cross section of a further embodiment of a nozzle body of a spray device according to the invention.

Another embodiment of a combined microvalve membrane layer unit is shown in FIG. 12 comprising a substantially planar nozzle-plate body 2 with a thickness of typically 100-675 micron and typical width of 0.4-5 mm and typical length of 0.4-5 mm where length and width do not need to be equal, multiple cavities 9 with a diameter of 10 to 100 μm, a membrane layer 6 made of materials like silicon, silicon nitride, silicon carbide, silicon oxide or diamond and with thickness of 0.1-2 microns, characterized in that a number of nozzle cavities 3 (typically in the range of 1 to 200 membranes) are formed underneath membrane layer 6 which has a number of nozzle orifices 7 (typically 1-500 orifices), in this specific case three nozzle orifices 7 per nozzle cavity 3. With preference the nozzle orifices 7 are placed in a configuration enabling repulsion forces exerted on the fluid inside the nozzle cavity 3, which fluid is replaced by air due to surface tension forces herewith safeguarding microbial integrity. In yet another preferred embodiment, the nozzle-plate body 2 is circular, triangular, hexagonal or the like.

Figure 13:
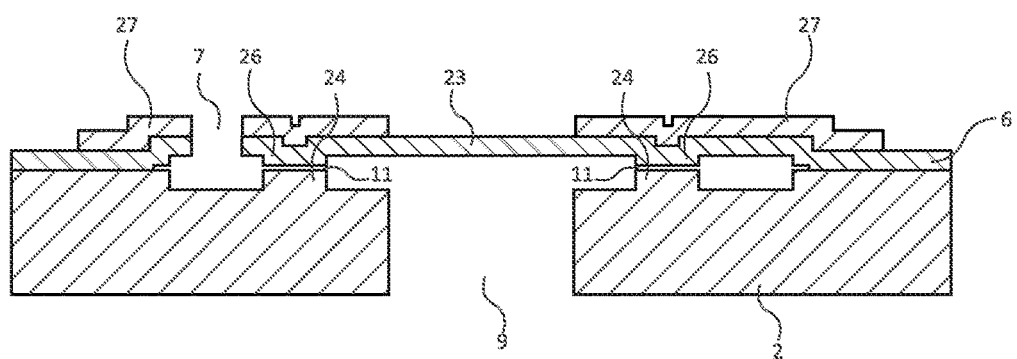
FIG. 13 shows a cross section of a preferred embodiment of a nozzle body of a spray device according to the invention.

Another preferred embodiment of a combined microvalve membrane-layer unit is depicted in FIG. 13 comprising a valve disc 23 made of thin-film material like silicon, silicon nitride, silicon carbide or silicon oxide with a diameter of 25-100 microns resting on a valve seat 24 with a diameter of 15-50 microns and a width of 1 to 15 microns, is characterized in that preferably ring-shaped corrugated zones 26 (with a width of 1-50 microns and height differences of 100 nanometres up to 10 microns) are present in the membrane layer 6 to facilitate opening of the valve blocking region 11.

The valve disc is integrated in a non-perforated area of the membrane layer 6 with, preferably, the same material as the valve disc 23 resting on a valve seat 24 in a closed position.

The valve disc 23 in the membrane layer 6 is movable upon an applied spray pressure, herewith creating a fluid passage (typically 50-1500 nanometres between the membrane layer and the valve seat. In the outer ring, downstream for the liquid, after the valve blocking region 11, one or more nozzle orifices 7 (with diameter 0.5-15 microns) may be present.

The valve seat 24 may be an integral part of the nozzle-plate support body 2, but it is understood that the valve seat 24 functionality may also be obtained by other means like adding structured materials on top of the nozzle-plate support body 2. Preferably the microvalve membrane-layer 6 is made with semi-conductor (or MEMS) technology and the nozzle-plate support body 2 and valve seat 24 is made from silicon, while the valve disc 24 is made from a thin film material, preferably silicon nitride, silicon carbide or silicon oxide with a thickness between 0.1-2 microns.

To enhance the closing force of the valve disc 23, an additional closing layer 27 of a thin-film material may be present on the valve disc 23, where the closing layer 27 may be structured to cover the valve disc 23 only in certain areas or on the full valve disc 23 and where the material may be firmly attached to the valve disc 23 or only be attached in certain regions on the valve disc 23 leaving free moment between the closing layer 27 and the valve disc 23, where the closing layer 27 is made of material with resulting compressive stress and the valve disc 23 is made of another material with less compressive stress than the closing layer 27, and preferably has tensile stress and where the closing layer 27 is preferably made of a thin-film material like silicon oxide or oxidized thin-film polysilicon with a thickness of typically 0.1-5 micron.

In another preferred embodiment the closing layer 27 contains charge and thus attracts to the valve seat 24. In yet another preferred embodiment the closing layer 27 is made of magnetic, ferromagnetic material or the like, such that the valve disc 27 can be closed using a magnetic material inside the valve seat 24 or an external magnet placed outside the spray nozzle chip and where the closing layer 27 is covered in human inert material like thin-film silicon nitride.

It may be preferential to have the nozzle orifices 7 present in the center part of the membrane. In that case, the functionality of the valve is then guaranteed by having one or more liquid inlets 9 placed under the outer ring, which then has no pores.

Figure 14:
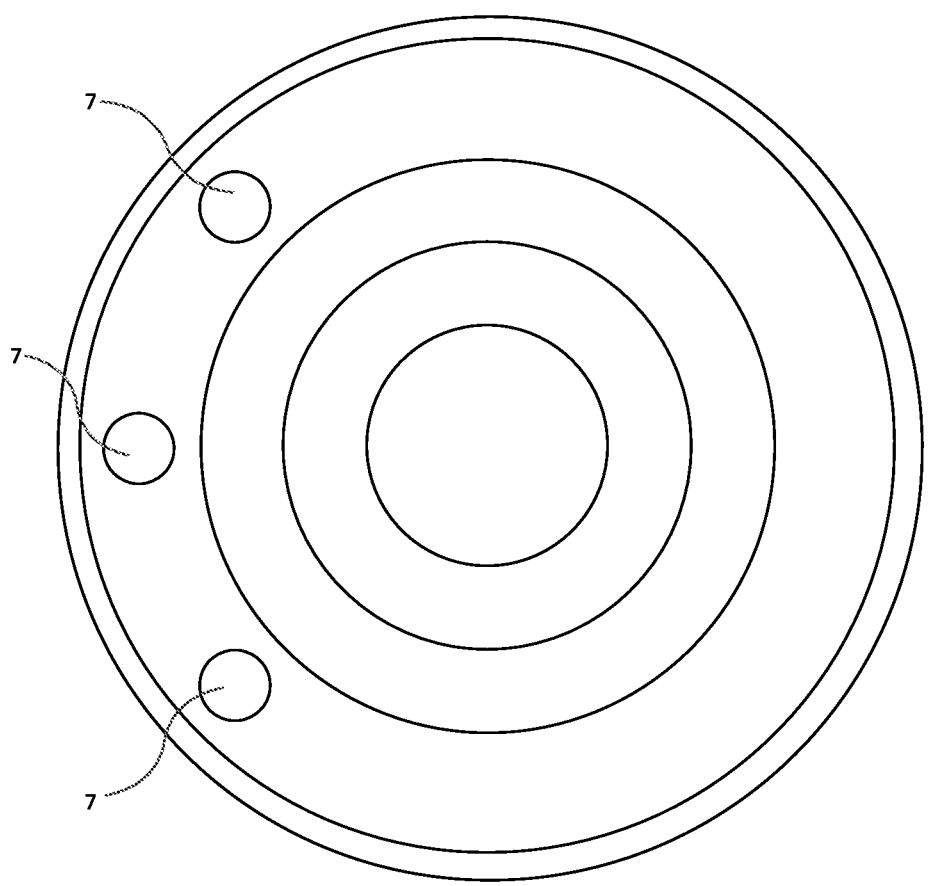
FIG. 14 shows the preferred embodiment of FIG. 13 in top view.

FIG. 14 shows the preferred embodiment of FIG. 13 in top view.

According to the invention it is preferred that combined microvalve membrane layer units are applied with a double microbial-integrity barrier, having an air-blocking barrier inside the nozzle cavity against the passage of microbes as well as a mechanical barrier against the passage of microbes between the nozzle cavity and the valve cavity.

Microbiological Report

Microbiological integrity has been studied with designs according to FIG. 9-11. A syringe is filled with a Maximum Recovery Diluent (MRD) solution and a SNU is put on the syringe. Pressure is given on the plunger in order to create a drop of 30 µµl MRD out of the SNU. The drop is dipped in a *Pseudomonas aeruginosa* suspension of ±100 cfu/ml, and this procedure is repeated 3 times a day and 4 days in a row. The SNU is incubated at 28-32° C. between the dipping. Afterwards the content of the syringes is transferred in TSB (Tripton Soy Broth) media and plated to examine the presence of bacteria. Controls are a Positive control: Syringe filled with 0.3 ml MRD solution and 0.1 ml *Pseudomonas aeruginosa* suspension and a Negative control: Syringe filled without bacteria. The different combined microvalve membrane layer embodiments as given in FIG. 9-11 have yielded 100% microbial-safe results of in total 30 tests. In another test, TSB was used instead of MRD. Here also the different combined microvalve-membrane layer embodiments have yielded 100% microbiological-safe results.

Although the invention has been described hereinbefore with reference to a number of certain embodiments, it will be understood that the invention is by no means restricted to these embodiments. Instead numerous embodiments and variations are feasible for a skilled person without departing from the scope and spirit of the invention.

Particularly the skilled person will appreciate that the following special embodiments emerge from the scope and spirit of the present invention:

Particular Embodiments of the Invention

Embodiments

1. A spray device, for spraying an fluidic microjet spray, comprising a spray nozzle unit, said spray nozzle unit comprising a fluid supply channel for receiving a pressurized fluid therein and comprising at least one spray nozzle having a nozzle membrane with at least one nozzle orifice for releasing a microjet spray of said fluid, characterized in that said spray nozzle is formed by a nozzle body, comprising a support body with at least one nozzle cavity at a main surface of said support body, said support body being covered by a membrane layer at said main surface and said membrane layer being provided with at least one nozzle orifice throughout a thickness of said membrane layer at an area of said at least one nozzle cavity to form said nozzle membrane over said nozzle cavity, in that said nozzle body comprises at least part of said fluid supply channel, and in that, upstream of said nozzle cavity, said nozzle body comprises a microbial barrier between said cavity and said at least part of said fluid supply channel that resides inside said support body.

2. Spray device according to embodiment 1, characterized in that said microbiological barrier comprises microvalve means that open once a predetermined upstream pressure threshold is exceeded and are in a normally-closed state in a non-pressurized state and that are provided upstream of said cavity between said cavity and said fluid supply channel.

3. Spray device according to embodiment 2, characterized in that the valve means open at a pressure threshold of between 2 and 5 bar and close once the downstream pressure thereon drops below a value that is lower than said pressure threshold, particularly below a value of between 1 and 2 bar.

4. Spray device according to embodiment 2 or 3, characterized in that said microbial barrier comprises an air chamber between said microvalve means and said nozzle cavity, said air chamber locking a quantity of air in said normally-closed state.

5. Spray device according to embodiment 4, characterized in that an inner wall of said air chamber has a hydrophobic surface, in particular by means of a hydrophobic antimicrobial coating such as a quaternary-ammonium coating.

6. Spray device according to embodiment 4 or 5, characterized in that said air chamber is in open communication with an outer atmosphere of said support body via a microbial filter allowing air to re-enter the air chamber after spraying said fluidic microjet spray.

7. A spray device according to embodiment 4, 5 or 6, characterized in that an air-purging chamber is provided, in that said air-purging chamber is pressurized before or during spraying via a pressurizing channel in the support body, in that pressurized air from the air-purging chamber is released after the spraying via a release channel to purge the air chamber and the nozzle cavity, and in that the air-purging chamber receives environmental air via a microbial filter.

8. Spray device according to anyone of embodiments 2 to 7, characterized in that said microvalve means comprise at least one microvalve disc in close proximity of a microvalve seat, said microvalve disc resting on said microvalve seat in said normally-closed state and lifting from said seat once said upstream pressure threshold is exceeded to create a fluid passage between said microvalve disc and said microvalve seat.

9. Spray device according to embodiment 8, characterized in that said support body comprises at least part of said fluid supply channel, in that, upstream of said nozzle cavity, said support body comprises a microbial barrier between said cavity and said at least part of said fluid supply channel that resides inside said support body, and in that said microvalve disc and said membrane are both formed by said membrane layer.

10. Spray device according to embodiment 8 or 9, characterized in that said support body comprises a plurality of nozzle cavities opening at said main surface of said support and being covered by a nozzle membrane having at least one nozzle orifice, and in that said cavities are each provided with similar microvalve means between said cavity and a fluid supply channel, particularly a common fluid supply channel that is shared among the orifices.

11. Spray device according to embodiment 8, 9 or 10 characterized in that a maximum distance between said valve disc and said valve seat is less than 500 nanometres, in particular less than 100-200 nanometres, in said normally-closed state.

12. Spray device according to anyone of embodiments 8 to 11, characterized in that said valve disc is configured to bend during operation from a substantially-flat initial state to an at least partly-curved profile under pressure while creating said fluid passage, and in that said valve seat comprises a closed edge that is located at the area of said curved profile of said valve disc.

13. Spray device according to embodiment 12, characterized in that said valve disc is configured to bend in that said valve disc is corrugated, comprising at least one generally ring-shaped corrugation along a generally ring-shaped valve seat.

14. Spray device according to embodiment 13, characterized in that said fluid supply channel is in open communication with an interior of said ring-shaped valve seat.

15. Spray device according to anyone of embodiments 8 to 14, characterized in that said valve means comprise a valve disc that is provided with resilient pressure means that force said valve disc against a valve seat in the normally-closed state.

16. Spray device according to any of the preceding embodiments, characterized in that said cavity has a generally-circular cross-section at said main surface.

17. Spray device according to anyone of the preceding embodiments, characterized in that, at least at an area adjacent to said at least one nozzle orifice, a bare surface of said spray nozzle has been treated to expel excess fluid away from a nozzle orifice.

18. Spray device according to embodiment 17, characterized in that said bare surface is hydrophobic adjacent to said orifice, particularly due to a hydrophobic antimicrobial coating, such as a quaternary-ammonium coating, applied to said support body at said main surface.

19. Spray device according to embodiment 17, characterized in that said support body is provided with a combination of at least one hydrophobic coating and at least one hydrophilic coating at said bare surface, at least surrounding said at least one orifice, said combination of coatings being micropatterned to promote a fluid movement away from the nozzle orifices.

20. Spray device according to any of the preceding embodiments, characterized in that said at least one nozzle orifice is hydrophobic.

21. Spray device according to any of the preceding embodiments, characterized in that said at least one nozzle orifice tapers down towards a bare surface of said nozzle body.

22. A spray device according to any of the preceding embodiments, characterized in that said at least one cavity is provided with antimicrobial coating over at least part of an interior wall thereof, in particular a hydrophobic antimicrobial coating such as a quaternary-ammonium coating.

23. Spray device according to any of the preceding embodiments, characterized in that said at least one cavity tapers down towards a bare surface of said nozzle body.

24. Spray device according to anyone of the preceding embodiments characterized in that a substantially airtight closure cap is provided over said nozzle body that opens during spraying and closes after spraying to counteract microbial immigration.

25. Spray device according to anyone of the preceding embodiments, characterized in that said support body comprises a plurality of cavities that are distributed at said main surface, particularly distributed angularly at said main surface, each one of said cavities being spanned by a nozzle membrane, and in that said support body comprises a common microbial barrier between said cavities and said fluid supply channel, upstream of said cavities.

26. Spray device according to anyone of the preceding embodiments, characterized in that said support body comprises a semiconductor material, and particularly in that said support body comprises a silicon body.

27. Spray device according to anyone of the preceding embodiments, characterized in that said membrane layer comprises a silicon-nitride layer, particularly of a thickness that is generally less than 2 microns.

28. Spray device according to anyone of the preceding embodiments, characterized by comprising a liquid supply system for supplying a pressurized liquid to said fluid supply channel of said at least one spray nozzle.

29. Spray nozzle body of the type as applied in the spray device according to anyone of the preceding embodiments.

The invention claimed is:

1. A spray device, for spraying a fluidic microjet spray, comprising a spray nozzle unit, said spray-nozzle unit comprising:

- a fluid supply channel for receiving a pressurized fluid therein; and
- a spray nozzle for releasing a microjet spray of said fluid,
  - wherein said spray nozzle is formed in a unitary nozzle support body, said nozzle support body comprising a nozzle cavity extending to a main surface of said nozzle support body,
  - wherein a part of said fluid supply channel resides inside said nozzle support body for supplying said pressurized fluid to said nozzle cavity, wherein said nozzle support body includes a membrane layer connected to said main surface of said nozzle support body, wherein said membrane layer includes at least one nozzle orifice throughout a thickness of said membrane layer at an area of said nozzle cavity, and wherein said nozzle support body comprises a microbial barrier within said nozzle support body upstream of said nozzle cavity, said microbial barrier being positioned between said nozzle cavity and said part of said fluid supply channel.

2. The spray device according to claim 1, wherein said microbial barrier comprises microvalve means that open once a predetermined upstream pressure threshold is exceeded and are in a normally-closed state in a non-pressurized state and that are provided upstream of said nozzle cavity between said nozzle cavity and said fluid supply channel.

3. The spray device according to claim 2, wherein the microvalve means close once a downstream pressure thereon drops below a value that is lower than said predetermined upstream pressure threshold, and wherein said predetermined upstream pressure threshold is between 2 and 5 bar.

4. The spray device according to claim 3, wherein said value is between 1 and 2 bar.

5. The spray device according to claim 2, wherein said nozzle support body comprises an air chamber between said microvalve means and said nozzle cavity, said air chamber locking a quantity of air in said normally-closed state.

6. The spray device according to claim 5, wherein an inner wall of said air chamber has a hydrophobic surface.

7. The spray device according to claim 6, wherein said air chamber has a hydrophobic surface by means of a hydrophobic antimicrobial coating.

8. The spray device according to claim 7, wherein said hydrophobic antimicrobial coating comprises a quaternary-ammonium coating.

9. The spray device according to claim 5, wherein said air chamber is in open communication with an outer atmosphere of said nozzle support body via a microbial filter allowing air to re-enter the air chamber after spraying said microjet spray.

10. The spray device according to claim 5, wherein an air-purging chamber is provided, wherein said air-purging chamber is pressurized before or during spraying via a pressurizing channel in the nozzle support body, wherein pressurized air from the air-purging chamber is released after the spraying via a release channel to purge the air chamber and the nozzle cavity, and wherein the air-purging chamber receives environmental air via a microbial filter.

11. The spray device according to claim 2, wherein said microvalve means comprise at least one microvalve disc in close proximity of a microvalve seat, said microvalve disc resting on said microvalve seat in said normally-closed state and lifting from said seat once said predetermined upstream pressure threshold is exceeded to create a fluid passage between said microvalve disc and said microvalve seat.

12. The spray device according to claim 11, wherein said microvalve disc and said membrane are both formed by said membrane layer.

13. The spray device according to claim 11, wherein said nozzle support body comprises a plurality of nozzle cavities opening at said main surface of said nozzle support body and being covered by a nozzle membrane having at least one nozzle orifice, and wherein said cavities are each provided with similar microvalve means between said cavity and a fluid supply channel, particularly a common fluid supply channel that is shared among the orifices.

14. The spray device according to claim 11, wherein a maximum distance between said valve disc and said valve seat is less than 500 nanometres, in particular less than 100-200 nanometres, in said normally-closed state.

15. The spray device according to claim 11, wherein said valve disc is configured to bend during operation from a substantially flat initial state to an at least partly curved profile under pressure while creating said fluid passage, and wherein said valve seat comprises a closed edge that is located at the area of said curved profile of said valve disc.

16. The spray device according to claim 15, wherein said valve disc is configured to bend in that said valve disc is corrugated, comprising at least one generally ring-shaped corrugation along a generally ring-shaped valve seat.

17. The spray device according to claim 16, wherein said fluid supply channel is in open communication with an interior of said ring-shaped valve seat.

18. The spray device according to claim 11, wherein said microvalve means comprise a valve disc that is provided with resilient pressure means that force said valve disc against a valve seat in the normally-closed state.

19. The spray device according to claim 1, wherein said nozzle cavity has a generally-circular cross-section at said main surface.

20. The spray device according to claim 1, wherein, at least at an area adjacent to said at least one nozzle orifice, a bare surface of said spray nozzle has been treated to expel excess fluid away from a nozzle orifice.

21. The spray device according to claim 20, wherein said bare surface is hydrophobic adjacent to said orifice, particularly due to a hydrophobic antimicrobial coating, such as a quaternary-ammonium coating, applied to said nozzle support body at said main surface.

22. The spray device according to claim 20, wherein said nozzle support body is provided with a combination of at least one hydrophobic coating and at least one hydrophilic coating at said bare surface, at least surrounding said at least one orifice, said combination of coatings being micropatterned to promote a fluid movement away from the nozzle orifices.

23. The spray device according to claim 1, wherein said at least one nozzle orifice is hydrophobic.

24. The spray device according to claim 1, wherein said at least one nozzle orifice tapers down towards a bare surface of said nozzle support body.

25. The spray device according to claim 1, wherein said nozzle cavity is provided with antimicrobial coating over at least part of an interior wall thereof.

26. The spray device according to claim 1, wherein said nozzle cavity tapers down towards a bare surface of said nozzle support body.

27. The spray device according to claim 1, wherein a substantially airtight closure cap is provided over said nozzle support body that opens during spraying and closes after spraying to counteract microbial immigration.

28. The spray device according to claim 1, wherein said nozzle support body comprises a plurality of cavities that are distributed at said main surface, particularly distributed angularly at said main surface, each one of said cavities being spanned by a nozzle membrane, and wherein said nozzle support body comprises a common microbial barrier between said cavities and said fluid supply channel, upstream of said cavities.

29. The spray device according to claim 1, wherein said nozzle support body comprises a semiconductor material.

30. The spray device according to claim 29, wherein said nozzle support body comprises a silicon body.

31. The spray device according to claim 1, wherein said membrane layer comprises a silicon-nitride layer.

32. The spray device according to claim 31, wherein said silicon-nitride layer has a thickness that is generally less than 2 microns.

33. The spray device according to claim 1, further comprising a liquid supply system for supplying said pressurized liquid to said fluid supply channel of said spray nozzle unit.

* * * * *